United States Patent
Kyle et al.

(10) Patent No.: US 6,509,520 B1
(45) Date of Patent: Jan. 21, 2003

(54) HIGH STRENGTH COMPOSITE THERMOELECTRIC COOLER AND METHOD FOR MAKING SAME

(75) Inventors: Robert Joseph Stephen Kyle, Rowlett, TX (US); Gail D. Shelton, Albuquerque, NM (US); Sam McKenney, Dallas, TX (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 08/487,820

(22) Filed: Jun. 7, 1995

(51) Int. Cl.[7] .................. H01L 35/34; H01L 35/28; H01L 35/02; F25B 21/02
(52) U.S. Cl. .................. 136/201; 136/203; 136/233; 62/3.2
(58) Field of Search ................. 136/201, 203, 136/204, 224, 230, 232, 233; 62/3.2

(56) References Cited

U.S. PATENT DOCUMENTS

| | | | | |
|---|---|---|---|---|
| 2,938,357 A | * | 5/1960 | Sheckler ................. | 62/3 |
| 2,959,017 A | * | 11/1960 | Gilman et al. .......... | 62/3 |
| 2,994,203 A | * | 8/1961 | Lackey et al. .......... | 62/3 |
| 3,095,709 A | * | 7/1963 | Demand .................. | 62/3 |
| 3,996,338 A | * | 12/1976 | Frampton ............... | 423/335 |
| 4,080,532 A | | 3/1978 | Hopper .................. | 250/332 |
| 4,162,402 A | | 7/1979 | Hopper .................. | 250/332 |
| 4,379,232 A | | 4/1983 | Hopper .................. | 250/332 |
| 4,465,895 A | * | 8/1984 | Verner et al. .......... | 136/225 |
| 4,493,939 A | | 1/1985 | Blaske et al. .......... | 136/212 |
| 4,615,595 A | | 10/1986 | Hornbeck ............... | 353/122 |
| 4,922,822 A | | 5/1990 | Bierschenk et al. .... | 136/204 |
| 5,021,663 A | | 6/1991 | Hornbeck ............... | 250/349 |
| 5,047,644 A | | 9/1991 | Meissner et al. ....... | 250/332 |
| 5,064,476 A | | 11/1991 | Recine, Sr. ............ | 136/201 |
| 5,156,004 A | * | 10/1992 | Wu et al. ............... | 62/3.1 |
| 5,168,339 A | * | 12/1992 | Yokotani et al. ....... | 257/64 |
| 5,209,786 A | * | 5/1993 | Rolfe et al. ............ | 136/211 |
| 5,221,364 A | * | 6/1993 | Hotaling ................ | 136/249 |
| 5,264,326 A | | 11/1993 | Meissner et al. ....... | 430/313 |
| 5,411,599 A | * | 5/1995 | Horn et al. ............. | 136/203 |
| 5,470,802 A | * | 11/1995 | Gnade et al. ........... | 437/238 |
| 5,544,487 A | * | 8/1996 | Attey et al. ............ | 62/3.7 |

* cited by examiner

Primary Examiner—Nam Nguyen
Assistant Examiner—Thomas H. Parsons
(74) Attorney, Agent, or Firm—Baker Botts L.L.P.

(57) ABSTRACT

A high-strength, single-staged, composite thermoelectric cooler (18) for stabilizing the temperature of an uncooled, infrared detector (16) comprising a pair of ceramic plates (20, 22), a plurality of thermoelectric elements (24) sandwiched between the plates (20, 22) such that the thermoelectric elements (24) and the ceramic plates (20, 22) define a plurality of chambers (26), and a thermoelectric insulator (28) which substantially fills the chambers (26) inside the thermoelectric cooler (18) forming a high-strength composite structure with the thermoelectric elements (24) and the ceramic plates (20, 22).

18 Claims, 3 Drawing Sheets though colder objects, such as people, trees and automobiles, emit most of their radiation in the lower energy, infrared (IR) part of the spectrum (3 $\mu$m to 12 $\mu$m wavelengths). Since the human eye cannot detect this low energy radiation, IR-sensitive detectors must be used to visually represent IR radiation.
HIGH STRENGTH COMPOSITE THERMOELECTRIC COOLER AND METHOD FOR MAKING SAME

TECHNICAL FIELD OF THE INVENTION

This invention relates in general to a single-staged thermoelectric cooler for stabilizing the temperature of an uncooled, infrared detector and, in particular to, a high-strength, composite thermoelectric cooler that resists fracture due to compressive or tensile stresses and dampens shearing forces.

BACKGROUND OF THE INVENTION

Every object, whether cold or hot, emits electromagnetic radiation. The radiation spectrum, however, for hot objects differs from that of cold objects. For example, the sun emits much of its radiation as visible light (0.4 $\mu$m to 0.7 $\mu$m wavelength). While colder objects, such as people, trees and automobiles, emit most of their radiation in the lower energy, infrared (IR) part of the spectrum (3 $\mu$m to 12 $\mu$m wavelengths). Since the human eye cannot detect this low energy radiation, IR-sensitive detectors must be used to visually represent IR radiation.

Conventional infrared detectors, known as photon detectors, produce an electrical response directly as a result of absorbing IR radiation. These detectors are strongly dependent on temperature. It is necessary to cryogenically cool these detectors to temperatures of approximately 80 K (−193° C.) in order to maintain high sensitivity.

An alternate type of IR sensor uses a thermal detector. These detectors do not require cryogenic temperatures to operate. Significant advances, in both simplicity and performance, have been achieved in this uncooled infrared technology field over the past several years. Uncooled IR systems have many advantages over conventional cooled IR systems, including cost, weight, size and power consumption. In addition, uncooled IR detection technology has allowed development of IR systems for commercial and military applications where low-cost, light weight, high reliability and low power consumption are critical requirements. These applications include surveillance devices, man-portable weapon sights, driver's aids, and seekers for missiles and smart submunitions.

However, like their cooled IR systems counterparts, the uncooled IR systems are temperature sensitive. The uncooled IR systems use thermal detectors to absorb IR radiation. The IR radiation causes the thermal detectors to experience a temperature change which in turn creates an electrical response which can be displayed on a video monitor. For proper operation, these detectors must be thermally isolated from their immediate surroundings to maximize the temperature change that results from the absorption from a small amount of IR radiation. In order to stabilize the temperature of the IR detector, current systems employ a thermoelectric cooler along with a temperature sensor. With the use of the thermoelectric cooler, the IR detector can remain at the optimum detector operating temperature for peak performance over varying ambient temperatures. This optimum temperature for uncooled IR systems is approximately room temperature, or 295 K.

Thermoelectric coolers are well-known in the art. Typical thermoelectric coolers use arrays of thermocouples which operate using the Peltier or Seebeck effects. The thermocouples are formed from a P-type thermal element and an N-type thermal element which have long been known for producing heating or cooling. These thermocouples generally use a P-type semiconductor or thermal element connected to an N-type semiconductor or thermal element to form a thermoelectric element. Thus, depending on the direction of the current flowing across the N and P junctions, the device may produce heating or cooling at the junction.

Typical single-staged thermoelectric coolers have two ceramic plates, a cold plate and a hot plate, located on either end of the thermoelectric elements. Depending upon the direction of the current, heat will be pumped from one plate to the other. Typically the top surface, the cold plate, will be held at a constant temperature. A temperature sensor on the cold plate sends signals to a power supply to control the direction of current flow which in turn controls the direction of heat flow between the cold plate and the hot plate.

An important characteristic of thermoelectric coolers are their efficiency ratings, which are inversely related to the thermal conductivity of heat between the cold plate and the hot plate. Thermal conductivity, and therefore efficiency, are related to the size of the thermoelectric elements, the number of elements and the air gap between the two plates. For example, the larger the air gap between the two plates, the lower the thermal conductivity and the higher the efficiency rating. In typical uncooled infrared detector applications, optimum efficiency can be reached when the thermoelectric cooler is placed in a ceramic package and the air is evacuated from the system.

The use of such uncooled IR detection systems, however, is limited due to the brittle nature of the thermoelectric elements which may result in fracture or breakage under rough handling or use in hostile environments. Such failures within the thermoelectric elements are typically caused by small shifts in the ceramic plates resulting in shearing forces within the thermoelectric elements. Also of concern, but less common, is failure due to compressive or tensile stresses within the thermoelectric elements.

In order to increase the strength of the thermoelectric coolers, conventional devices have increased the size of the thermoelectric elements. However, with an increase in size of the thermoelectric elements comes a decrease in thermal efficiency of the thermoelectric cooler. Other devices have potted the cooler with an epoxy resin which greatly increases the strength of the thermoelectric cooler, however, this approach also results in a decrease in efficiency of the thermoelectric cooler. A need has therefore arisen for a thermoelectric cooler for stabilizing the temperature of an uncooled infrared detector having high strength without having a loss in efficiency.

SUMMARY OF THE INVENTION

The present invention disclosed herein comprises a high-strength, single-staged, composite thermoelectric cooler for stabilizing the temperature of an uncooled, infrared detector. The composite structure of the thermoelectric cooler resists compressive and tensile stresses and dampening shearing forces. Complementing the high-strength feature of the composite structure, this thermoelectric cooler operates at a high level of efficiency.

In accordance with one aspect of the present invention, the high-strength, composite thermoelectric cooler comprises a pair of parallel ceramic plates, a cold plate and a hot plate. A plurality of thermoelectric elements is thermally coupled between the cold plate and the hot plate. The thermoelectric elements are made of N and P type semiconductor material such as bismuth telluride ($Bi_2Te_3$). The unoccupied volume between the cold plate and the hot plate defines a plurality of chambers. These chambers are substantially filled with a thermoelectric insulator creating a composite structure which resists compressive and tensile stresses and dampens shearing forces.

To maintain a suitable efficiency rating, the thermoelectric insulator material has a very low density and a very low thermal conductivity similar to that of air. This low thermal conductivity allows the thermoelectric cooler to operate at an efficiency rating substantially the same as that for a thermoelectric cooler operating with an air gap between the ceramic plates, noting that operating in a vacuum the thermal conductivity of air will increase. The thermoelectric insulator can be selected from a group consisting of an aerogel, a xerogel or other similar porous material having a low thermal conductivity.

In accordance with another aspect of the current invention, a wet precursor gel is potted into the chambers between the ceramic plates in the thermoelectric cooler. At a point above the critical point of the gel, pore fluid is extracted from the gel forming the aerogel within the thermoelectric cooler thereby creating a high strength composite structure. In accordance with another aspect of the present invention, liquid $CO_2$ is used to replace pore fluid in the wet precursor gel. At a point above the critical point of $CO_2$, the $CO_2$ is extracted from the gel forming the aerogel between the two ceramic plates thereby creating a high strength composite structure within the thermoelectric cooler.

In yet another aspect of the present invention the wet precursor gel is placed in a mixture with a surface modifying compound and a solvent. This mixture is washed and potted into the chambers between the ceramic plates in the thermoelectric cooler. The mixture is dried in the chambers under ambient conditions forming an xerogel in a composite structure inside the thermoelectric cooler.

BRIEF DESCRIPTION OF THE DRAWINGS

For a more complete understanding of the present invention, including its features and advantages, reference is now made to the following detailed description, taken in conjunction with the accompanying drawing in which.

DETAILED DESCRIPTION OF THE INVENTION

The present invention comprises a high-strength thermoelectric cooler and a method for strengthening a thermoelectric cooler. The apparatus and method comprise filling the chambers between the ceramic plates of a thermoelectric cooler with a thermoelectric insulator that has a very low density and a very low thermal conductivity to provide high strength without loss of thermal efficiency.

Figure 1:
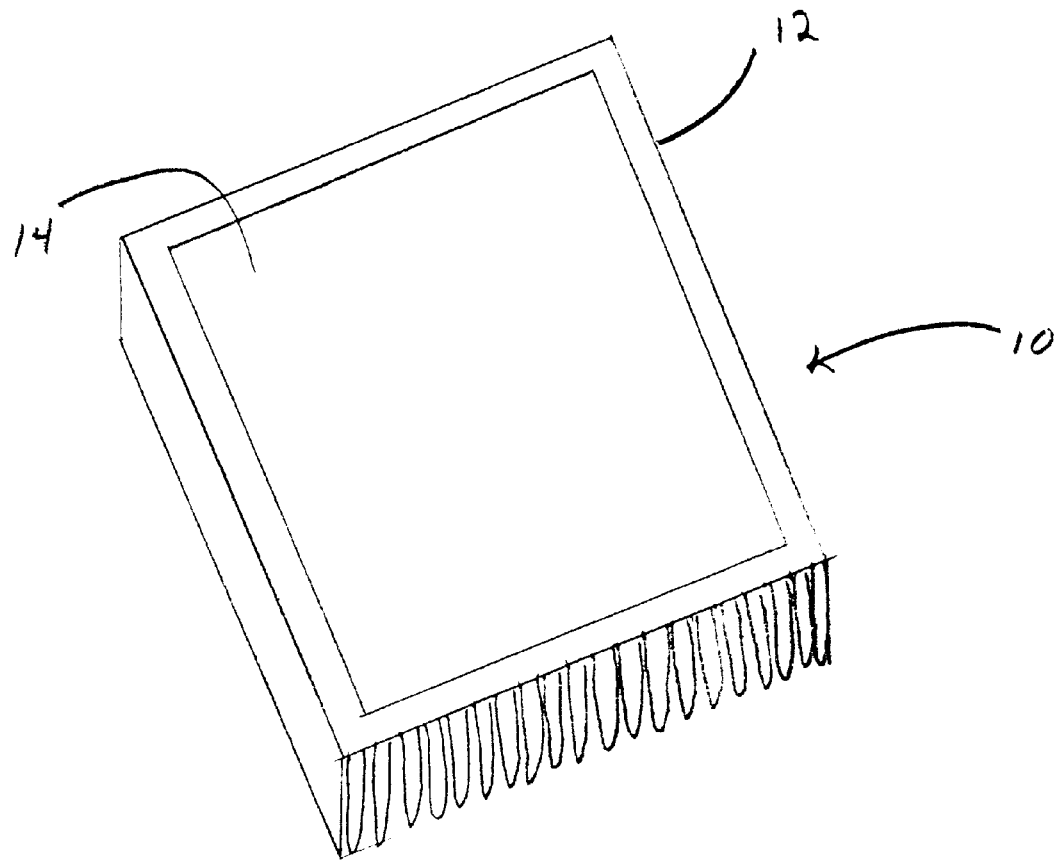
FIG. 1 is a perspective view illustrating a typical infrared detector assembly.

Referring initially to FIG. 1, a drawing representing a typical uncooled infrared detector assembly is depicted. The infrared detector assembly is generally designated as 10. The housing of detector assembly 10 is a 40-pin ceramic package 12. Infrared radiation pass through germanium window 14 into detector assembly 10. Detector assembly 10 has military applications such as weapon sights and seeker for missiles and smart submunitions as well as commercial applications including surveillance devices for law enforcement, stationary security, and vision enhancement for trucks and automobiles.

Figure 2:
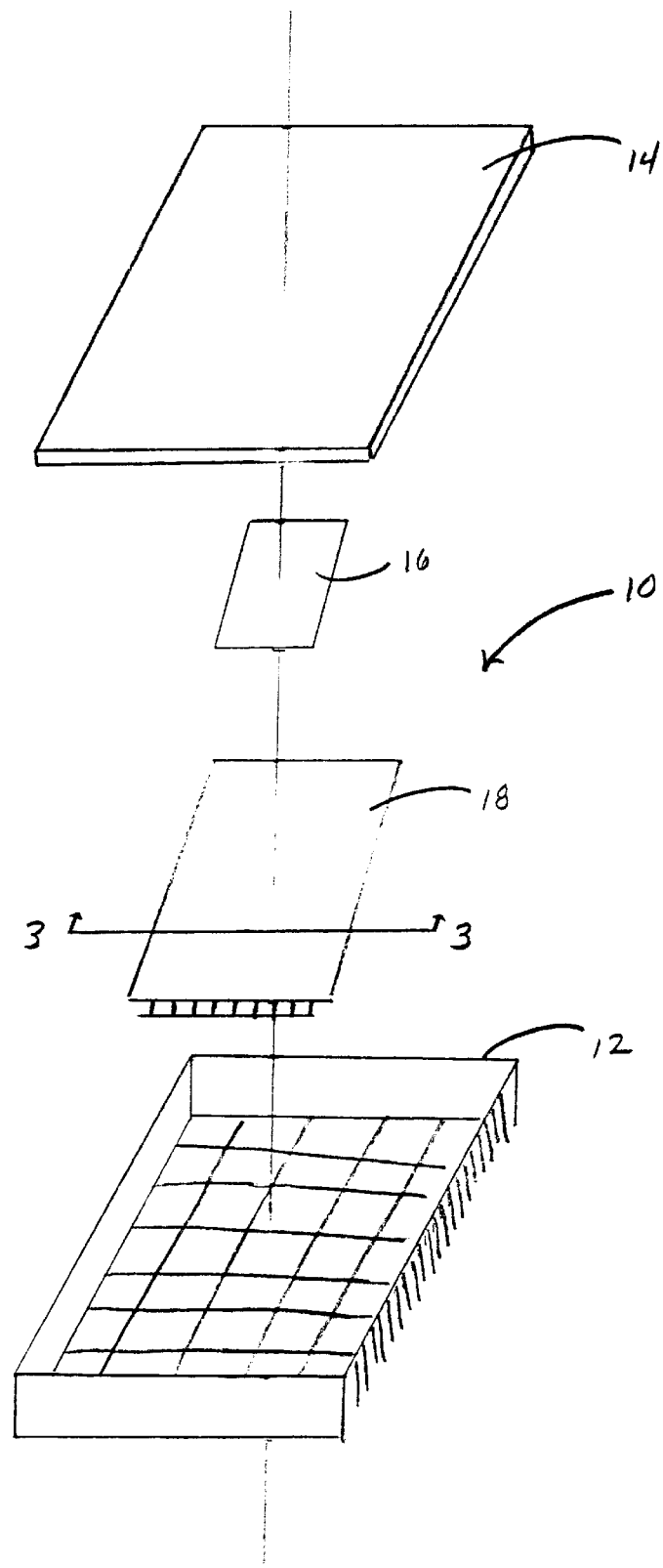
FIG. 2 is an exploded view of the infrared detector assembly of FIG. 1.

Referring next to FIG. 2, an exploded view of detector assembly 10 is depicted. Between ceramic package 12 and germanium window 14 is infrared detector 16 and thermoelectric cooler 18. Infrared detector 16 is a thermal detector which experiences temperature changes when IR radiation is absorbed. These temperature changes are converted to electrical responses which are typically transformed into a video display. For peak performance infrared detector 16 operated at or near room temperature. Thermoelectric cooler 18 and a temperature sensor (not pictured) are used to stabilized the temperature of infrared detector 16 to maintain peak performance.

Figure 3:
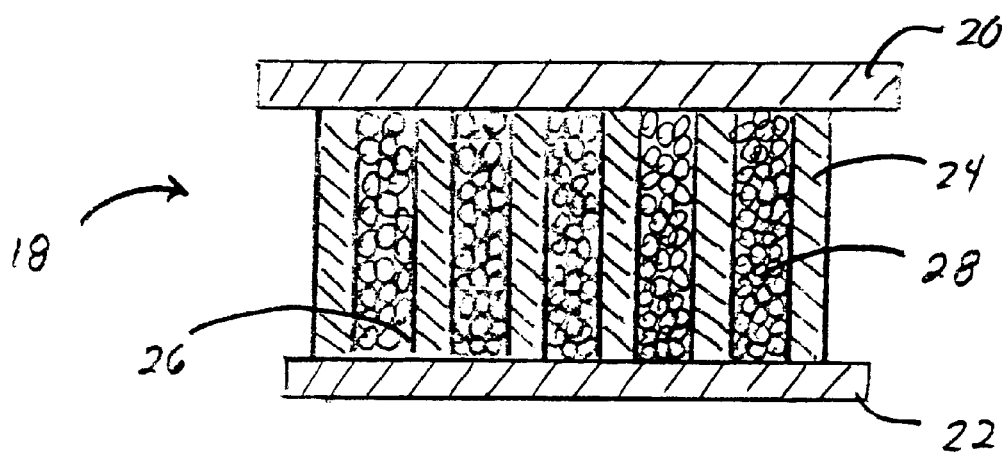
FIG. 3 is a sectional view taken along line 3—3 of FIG. 2 illustrating the composite structure of a thermoelectric cooler.

Now referring to FIG. 3, a drawing representing a cross-section of thermoelectric cooler 18 is depicted. Thermoelectric cooler 18 has a cold ceramic plate 20 which is typically held at a constant temperature to stabilize the temperature of infrared detector 16 (see FIG. 2) Thermoelectric cooler 18 also has a hot ceramic plate 22 that is parallel with cold ceramic plate 20 and spaced a distance apart from cold ceramic plate 20. Thermoelectric cooler 18 further comprises a plurality of thermoelectric elements 24 arranged in an array between cold ceramic plate 20 and hot ceramic plate 22.

Thermoelectric elements 24 are thermocouples which operate using the Peltier or Seebeck effects. Thermoelectric elements 24 comprise a P-type thermal element and an N-type thermal element which produce heating or cooling in response to an electrical current. Thermoelectric elements 24 use a P-type semiconductor or thermal element connected to an N-type semiconductor or thermal element such that, depending on the direction of the current flowing across the N and P junctions, the device may produce heating or cooling at the junction. Heat flow may be either from cold ceramic plate 20 to hot ceramic plate 22 or from hot ceramic plate 22 to cold ceramic plate 20 depending on the direction of current flow as required to maintain a constant temperature for infrared detector 16.

Still referring to FIG. 3, chambers 26 are defined by the unoccupied space between cold ceramic plate 20, hot ceramic plate 22, and thermoelectric elements 24. Thermoelectric insulator 28 is potted within chambers 26 substantially filling chambers 26 forming a high strength composite structure with thermoelectric elements 24 that resists compressive and tensile stresses and dampens shearing forces.

In a preferred embodiment, thermoelectric insulator 28 is a material which has a very low density and a very low thermal conductivity such that thermoelectric insulator 28 has very little effect on the efficiency rating of thermoelectric cooler 18. In a preferred embodiment, thermoelectric insulator 28 is selected from a group consisting of an aerogel, an xerogel, and other similar materials having high porosity and low thermal conductivity.

The data below is found in U.S. patent application Ser. No. 08/055,069 filed on Apr. 28, 1993 which is hereby incorporated by reference. In a preferred embodiment, thermoelectric insulator 28 is an aerogel having a porosity between about 0.85 and 0.98, a density as low as 0.003 $g/cm^3$, and a thermal conductivity of about 0.02 W/mK. In another preferred embodiment, the aerogel has substantially the same thermal conductivity as air so as to minimize any loss of thermal efficiency within thermoelectric cooler 18.

Aerogel is formed by drying a wet gel selected from a group consisting of inorganic metal oxide gels, composite inorganic-organic gels, and organic gels. For example, aerogels are made from inorganic metal oxides such as silica ($SiO_2$) or alumina ($Al_2O_3$). In a preferred embodiment the wet gel is potted in chambers 26 of thermoelectric cooler 18 after thermoelectric cooler 18 has been mounted into ceramic package 12. Ceramic package 12 is placed in an autoclave (not pictured) or similar device and raised above the critical point of the gel (Tc=243° C., Pc=63 bars for ethanol) forming a supercritical fluid. Pore fluid from the wet gel is extracted forming the aerogel in place, thereby creating a high strength composite structure within thermoelectric cooler 18.

In another embodiment of the invention, the pore fluid of the wet gel is first replaced by liquid $CO_2$. After potting chambers 26 with the wet gel, the liquid $CO_2$ is extracted from the gel at a temperature and pressure above the critical point of $CO_2$ (Tc=31° C., Pc=73 bars). This process occurs at a much lower temperature than the non $CO_2$ replacement process.

In one embodiment of the invention, thermoelectric insulator 28 is an xerogel. To form the xerogel, the wet gel is placed in a mixture with a surface modifying compound (having the general form of $R_xM_y$ where R is an organic group such as $CH_3$ or $C_2H_5$ and X is a halogen such as Cl) and a solvent such as benzene or toluene. The wet gel is potted into chambers 26 of thermoelectric cooler 18 which has been mounted in ceramic package 12. The wet gel is dried at a sub-critical pressure forming a xerogel within chambers 26 creating a high strength composite structure within thermoelectric cooler 18.

In summary, an advantageous apparatus and method have been disclosed that feature a high strength composite thermoelectric cooler for stabilizing the temperature of an uncooled infrared detector comprising a thermoelectric insulator having a low thermal conductivity which has little effect on the efficiency rating of the thermoelectric cooler.

While preferred embodiments of the invention and their advantages have been disclosed in the above detailed description, the invention is not limited thereto but only by the spirit and scope of the appended claims.

What is claimed is:

1. A high strength single-staged thermoelectric cooler for stabilizing the temperature of an uncooled infrared detector assembly comprising:
    a first ceramic plate;
    a second ceramic plate parallel to and spaced apart from said first ceramic plate;
    a plurality of thermoelectric elements thermally coupled between said first plate and said second plate each having a p-junction and an n-junction, said thermoelectric elements and said ceramic plates defining a plurality of chambers; and
    a thermoelectric insulator substantially filling said chambers thereby creating a composite structure with a high resistance to shearing forces, wherein said thermoelectric insulator is an aerogel.

2. The high strength single-staged thermoelectric cooler as recited in claim 1 wherein said aerogel has a porosity between approximately 0.85 and 0.98.

3. The high strength single-staged thermoelectric cooler as recited in claim 1 wherein said aerogel comprises a dried product of a wet gel selected from a group consisting of an inorganic metal oxide gel, a composite inorganic-organic gel, and an organic gel.

4. A high strength single-staged thermoelectric cooler for stabilizing the temperature of an uncooled infrared detector assembly comprising:
    a first ceramic plate;
    a second ceramic plate parallel to and spaced apart from said first ceramic plate;
    a plurality of thermoelectric elements thermally coupled between said first plate and said second plate each having a p-junction and an n-junction, said thermoelectric elements and said ceramic plates defining a plurality of chambers; and
    a thermoelectric insulator substantially filling said chambers thereby creating a composite structure with a high resistance to shearing forces, wherein said thermoelectric insulator is a xerogel.

5. A high strength single-staged thermoelectric cooler comprising:
    a pair of parallel ceramic plates spaced a distance apart from on another;
    a plurality of thermoelectric elements sandwiched between said plates defining a plurality of chambers; and
    an aerogel substantially filling said chambers.

6. The high strength single-staged thermoelectric cooler as recited in claim 5 wherein said aerogel, said thermoelectric elements, and said ceramic plates form a high strength composite structure.

7. The high strength single-staged thermoelectric cooler as recited in claim 5 wherein said aerogel has a porosity between approximately 0.85 and 0.98.

8. The high strength single-staged thermoelectric cooler as recited in claim 5 wherein said aerogel comprises a dried product of a wet gel selected from a group consisting of a inorganic metal oxide gel, a composite inorganic-organic gel, and an organic gel.

9. The high strength single-staged thermoelectric cooler as recited in claim 5 wherein said aerogel comprises a dried product of a silica gel.

10. The high strength single-staged thermoelectric cooler as recited in claim 5 wherein said aerogel has a thermal conductivity of approximately 0.02 W/mK.

11. The high strength single-staged thermoelectric cooler as recited in claim 5 wherein said aerogel has substantially the same thermal conductivity as air thereby minimizing any loss of thermal efficiency.

12. A method for strengthening a thermoelectric cooler for use in an uncooled infrared detector assembly comprising:
    providing a pair of ceramic plates disposed in space parallel to one another;
    thermally coupling a plurality of thermoelectric elements between said ceramic plates creating a plurality of chambers therebetween in the volume unoccupied by said thermoelectric elements;
    potting said chambers with a thermoelectric insulator, wherein said thermoelectric insulator is an aerogel; and
    forming a high strength composite structure which resists compressive and tensile stresses and dampens shearing forces.

13. The method for strengthening a thermoelectric cooler as recited in claim 12 further comprising the steps of:
    mounting the thermoelectric cooler into a ceramic package; and
    filling said ceramic package with said thermoelectric insulator.

14. The method for strengthening a thermoelectric cooler as recited in claim 12 wherein said aerogel comprises a dried product of a wet gel selected from a group consisting of an inorganic metal oxide gel, a composite inorganic-organic gel, and an organic gel.

15. The method for strengthening a thermoelectric cooler as recited in claim 12 wherein the step of forming a high strength composite structure comprises removing pore fluid from said wet gel at a temperature and a pressure above the critical point of said wet gel.

16. The method for strengthening a thermoelectric cooler as recited in claim 12 wherein the step of forming a high strength composite structure comprises replacing the pore fluid of said aerogel with liquid $CO_2$ and removing said $CO_2$ from said aerogel at a temperature and pressure above the critical point of said $CO_2$.

17. A method for strengthening a thermoelectric cooler for use in an uncooled infrared detector assembly comprising:

providing a pair of ceramic plates disposed in space parallel to one another;

thermally coupling a plurality of thermoelectric elements between said ceramic plates creating a plurality of chambers therebetween in the volume unoccupied by said thermoelectric elements;

potting said chambers with a thermoelectric insulator, wherein said thermoelectric insulator is a xerogel; and forming a high strength composite structure which resist compressive and tensile stress and dampens shearing forces.

18. The method strengthening a thermoelectric cooler as recited in claim 17 wherein the step of forming a high strength composite structure comprises drying said xerogel at a sub-critical pressure.

* * * * *